United States Patent [19]

Nakajima et al.

[11] Patent Number: 4,747,083
[45] Date of Patent: May 24, 1988

[54] SEMICONDUCTOR MEMORY WITH SEGMENTED WORD LINES

[75] Inventors: Tetsuya Nakajima, Yokohama; Masaki Nagahara, Kawasaki, both of Japan

[73] Assignee: Fujitsu Limited, Kawasaki, Japan

[21] Appl. No.: 625,674

[22] Filed: Jun. 28, 1984

[30] Foreign Application Priority Data

Jun. 29, 1983 [JP] Japan ................... 58-115881

[51] Int. Cl.$^4$ .................................................. G11C 8/00
[52] U.S. Cl. ..................................... 365/230; 365/179
[58] Field of Search ............. 365/230, 174, 226, 242, 365/155, 179, 63, 72, 227

[56] References Cited

U.S. PATENT DOCUMENTS

| | | | |
|---|---|---|---|
| 4,262,340 | 4/1981 | Sasaki et al. | 365/189 |
| 4,370,736 | 1/1983 | Takahashi | 365/179 |
| 4,417,326 | 11/1983 | Toyoda et al. | 365/189 |

FOREIGN PATENT DOCUMENTS 0019241 11/1980 European Pat. Off.

OTHER PUBLICATIONS

Patent Abstracts of Japan, Vol. 6, No. 233 (P-156), Nov. 19, 1982; JP-A-57-133586

| | | | |
|---|---|---|---|
| 0105386 | 8/1981 | Japan | 365/174 |
| 0176590 | 10/1982 | Japan | 365/230 |
| 0094187 | 6/1983 | Japan | 365/174 |

Primary Examiner—Stuart N. Hecker
Assistant Examiner—Glenn A. Gossage
Attorney, Agent, or Firm—Staas & Halsey

[57] ABSTRACT

A semiconductor memory device including at least word lines and bit lines with memory cells located at each cross point therebetween. Each of the word lines is divided to form segmented word lines and each of the word line segments is driven by an individual private word driver. The individual private word drivers are activated together in response to a word selection signal. Level shifting diodes are employed in the bit line drivers to offset a voltage level change caused by the segment word drivers.

7 Claims, 5 Drawing Sheets

SEMICONDUCTOR MEMORY WITH SEGMENTED WORD LINES

BACKGROUND OF THE INVENTION

1. Field of the Invention

The present invention relates to a semiconductor memory device (hereinafter "memory"), more particularly to a memory of a static random access memory (S.RAM) type composed of emitter-coupled-logic (ECL) memory cells.

Various types of memories have been developed and put into practical use. Recent research and development has concentrated in achieving greater miniaturization of memory patterns, i.e., increasingly higher densities of packaging of integrated circuit (IC) memories. To fabricate a denser IC memory, however, it is not sufficient merely to miniaturize the memory cells and wiring. Miniaturization creates additional problems which themselves must be solved.

2. Description of the Prior Art

In a prior art ECL-type S.RAM, increased miniaturization and higher integration create the problem of electromigration. More specifically, when the current density of, for example, aluminum wiring exceeds a predetermined threshold level, since the aluminum wiring is made narrower in width upon miniaturization, the aluminum in a solid state is transformed by heat into a molten state and will flow elsewhere.

When electromigration takes place, the desired memory function cannot be guaranteed. Therefore, excessive current density must be prevented, not only for aluminum wiring but all other wiring of other conductive materials, to suppress electromigration.

SUMMARY OF THE INVENTION

It is an object of the present invention to provide a semiconductor memory device, particularly an ECL-type S.RAM, which can reduce the current density of wiring, even for narrow-width wiring used in miniaturized memories.

Consideration is given to reducing the current density of all word lines of a memory since there is considerable likelihood of electromigration in each word line due to their inherent roles. Each word line is divided into a plurality of segmented word lines. Each segmented word line is connected to an individual word driver and provided with memory cells, etc. Each of the segmented word lines carries an individual word current from an individual word driver when the word line is in a selection state.

BRIEF DESCRIPTION OF THE DRAWINGS

The present invention will be more apparent from the ensuing description with reference to the accompanying drawings, wherein.

DESCRIPTION OF THE PREFERRED EMBODIMENTS

Before describing the preferred embodiments, a discussion will be made of a prior art device for reference purposes.

Figure 1:
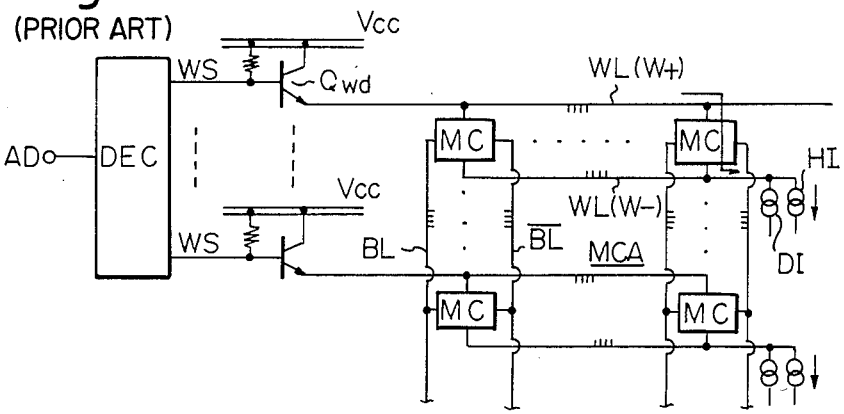
FIG. 1 is a circuit diagram representing a part of a typical semiconductor memory device.

FIG. 1 is a circuit diagram representing a part of a typical semiconductor memory device. The memory illustrated in FIG. 1 is specifically an ECL-type S.RAM. In FIG. 1, reference characters MC indicate memory cells which cooperate with each word line pair WL. Each pair is comprised of word lines $W_+$ and $W_-$. Many identical sets of word line pairs WL and memory cells MC are arranged in the direction along which bit line pairs (BL, $\overline{BL}$) extend. Thus, many memory cells MC are located at cross points of the word lines and the bit line pairs. These memory cells MC constitute a memory cell array having rows and columns, indicated by MCA.

In a usual S.RAM, each word line $W_-$ is arranged with a respective word line $W_+$ as a pair. Each pair of these word lines $W_+$ and $W_-$ is connected to an individual hold current source HI. The hold current of each source HI maintains the logic "1" or "0" stored in each memory cell MC. Each word line $W_+$ is selected by a corresponding word selection signal WS supplied by a word decoder DEC in accordance with an address input AD. The selection is achieved by turning on an individual word driver $Q_{wd}$ connected to the word line $W_+$ at its end. On the other hand, similar drivers, i.e., bit drivers (mentioned hereinafter) are provided for respective bit line pairs BL, $\overline{BL}$, in the memory.

In FIG. 1, there is significant electromigration in the word lines $W_+$. A relatively large current may flow through each word line $W_+$ due to, first, the hold current continually supplied to all the memory cells MC of each word line $W_+$ and, second, a discharge current flowing to each discharge current source (DI) every time the word line pair WL is selcted. In other words, the above-mentioned large current along the word line $W_-$ is the sum of the hold current ($I_h$) and the discharge current ($I_d$) and is generated every time the word line $W_-$ is in a selection state. It should be noted that of the various types of memories, a bipolar ECL-type S.RAM exhibits the largest $I_h$ and $I_d$ currents. Incidentally, as is well known, the discharge current is useful to effect a quick change from the selection state to the nonselection state.

Figure 2A:
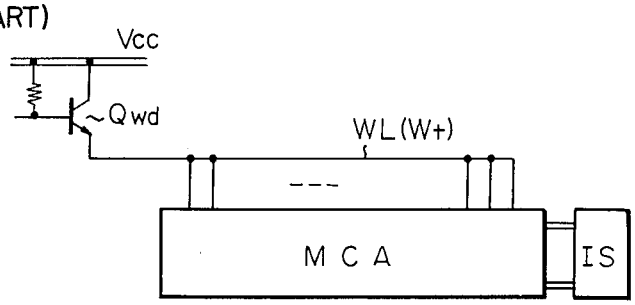
FIG. 2A is a partial view of a semiconductor memory device equivalent to that of FIG. 1, but drawn somewhat more simply.
Figure 2B:
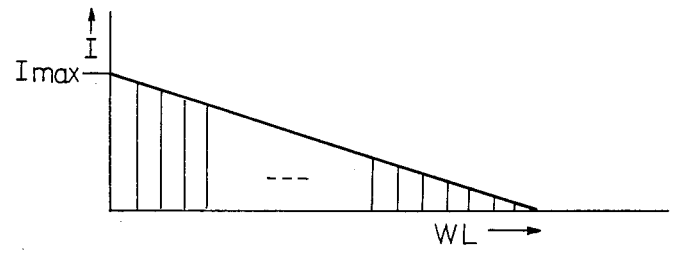
FIG. 2B is a diagram depicting the distribution of current density in and along a word line of FIG. 2A.

FIG. 2A is a partial view of a semiconductor memory device equivalent to that of FIG. 1, but drawn somewhat more simply. FIG. 2B is a diagram depicting the distribution of current density in and along the word line WL of FIG. 2A. The memory cell array MCA of FIG. 1 is represented simply as a block "MCA" in FIG. 2A. Also, both the hold current source HI and the discharge current source DI are represented simply as a block "IS" in FIG. 2A. In FIG. 2B, the abscissa denotes positions on and along the same word line WL as that of FIG. 2A, and the ordinate denotes a current I flowing therethrough. As illustrated in FIGS. 2A and 2B, the peak current density is $I_{max}$, which iss produced at a current supply side of the word line, i.e., the end of the word line to which the word driver $Q_{wd}$ is connected.

Figure 3:
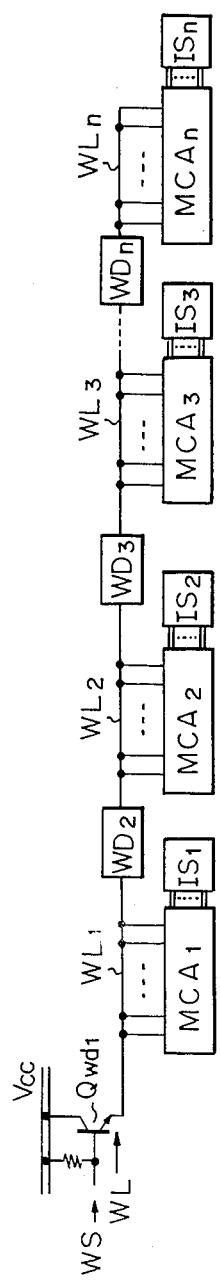
FIG. 3 is a general view of a semiconductor memory device according to the present invention, taking an arbitrary word line as an example.

FIG. 3 is a general view of a semiconductor memory device according to the present invention, taking an arbitrary word line as an example. As seen from FIG. 3, the word line WL is divided to form, along its length, a plurality of segmented word lines. Each of the word line segments $WL_1$, $WL_2$, $WL_3$, ..., $WL_n$, except for the first segment $WL_1$ activated directly by the word driver $Q_{wd1}$, is provided with an individual private word driver, i.e., $WD_2$, $WD_3$ ... $WD_n$. When the corresponding word selection signal WS is used to supply a current individually to the memory cells in $MCA_1$ for the word line segment $WL_1$, the second private word driver $WD_2$ is operated in response to the word line signal appearing at the first word line segment $WL_1$. At the same time, the third and following private word drivers $WD_3$, ..., $WD_n$ are operated in response to the word line signals appearing at preceding word line segments $WL_2$, $WL_3$, ..., $WL_{(n-1)}$ (not shown), respectively. In this regard, the memory cell array MCA and the drive current source IS, both shown in FIG. 2A, are segmented as $MCA_1$, $IS_1$; $MCA_2$, $IS_2$; $MCA_3$, $IS_3$; ... and so on.

Figure 4A:
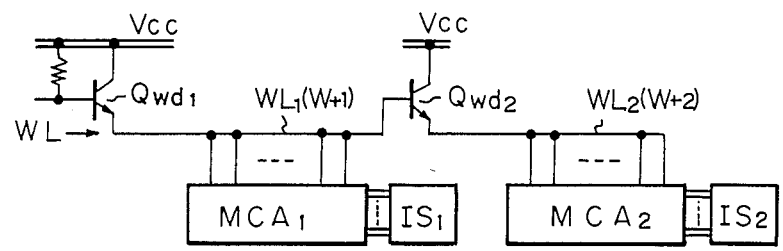
FIG. 4A is a circuit diagram of a part of a semiconductor memory device according to a first embodiment of the present invention.
Figure 4B:
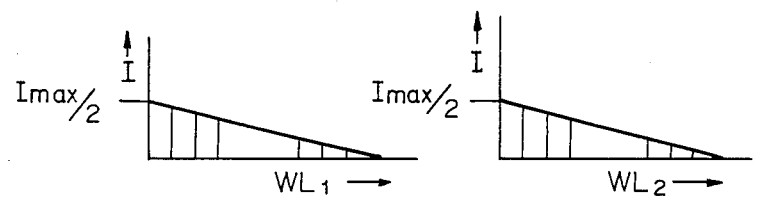
FIG. 4B is a diagram depicting the distribution of current density in and along the word line segments of FIG. 4A.

FIG. 4A is a circuit diagram of a part of a semiconductor memory device according to a first embodiment of the present invention. FIG. 4B is a diagram depicting the distribution of current density in and along the word line segments of FIG. 4A. Incidentally, in this specification, reference characters which are the same as in different figures represent the same components in each figure.

The explanation of FIGS. 4A and 4B will, for simplicity, be made taking as an example a case where the memory is segmented into two blocks. That is, the word line WL is divided to form first and second word line segments $WL_1$ and $WL_2$. Therefore, the memory cells and the current source are also segmented to form $MCA_1$, $IS_1$ and $MCA_2$, $IS_2$. In a first block, the word driver $Q_{wd1}$ is connectedd to the first word line segment $WL_1$. The word driver $WD_2$ of FIG. 3 is specifically comprised of a word driver $Q_{wd2}$. Other word drivers $WD_3$, ..., $WD_n$ of FIG. 3 are identical to the word driver $WD_2$ shown in FIG. 4A, i.e., a single transistor $Q_{wd2}$. In the example of FIG. 4A, the distribution of current density is as illustrated in FIG. 4B. It is important to note that the peak current density in each of the word line segments $WL_1$ and $WL_2$ is approximately halved to $I_{max}/2$, the value $I_{max}$ being that obtained in the prior art device illustrated in FIGS. 2A and 2B.

According to the first embodiment of FIG. 4A, the word driver transistor $Q_{wd2}$ is directly connected, at its base, to the preceding word line segment, i.e., $WL_1$, so as to activate the transistor $Q_{wd2}$ in response to the word selection signal WS. That is, when the signal WS is received by the word driver $Q_{wd1}$, the word line signal appears with an "H" (high) level on the segment $WL_1$. The "H" level signal is immediately transferred, via the transistor $Q_{wd2}$, to the following word line segment, i.e., $WL_2$. Thus, the whole corresponding word line WL is selected. The above construction has the advantage that no separate control line is needed to activate the word driver transistor $Q_{wd2}$.

Referring to FIG. 4A, the word line WL is segmented into $WL_1$ and $WL_2$ with the use of the word driver transistor $Q_{wd2}$. In this case, the voltage level at the word line segment $WL_2$ is lowered by $V_{BE}$ from that of the word line segment $WL_1$. The character $V_{BE}$ denotes a base-emitter voltage of the word driver transistor $Q_{wd2}$. The thus lowered voltage of the segment $WL_2$ has a deleterious effect on the operation of the memory cell array $MCA_2$ which will be further explained with reference to FIG. 5.

Figure 5:
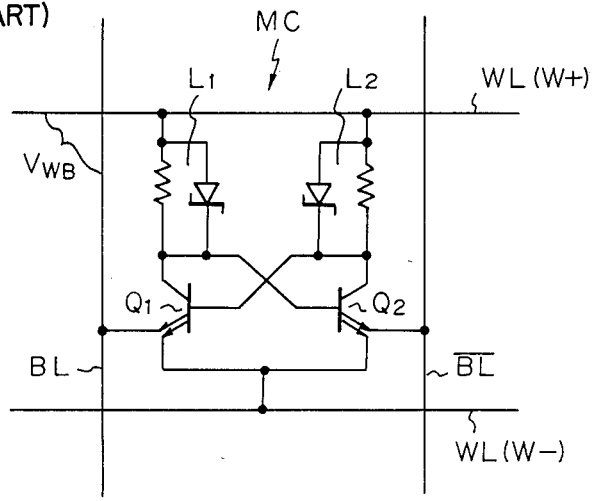
FIG. 5 illustrates a detailed example of a known memory cell in FIG. 1.

FIG. 5 illustrates a detailed example of the known memory cell MC in FIG. 1. As seen from FIG. 5, each memory cell MC is comprised of multiemitter transistors $Q_1$ and $Q_2$ and loads $L_1$ and $L_2$. Each of the loads comprises a resistor and a Schottky barrier diode connected in parallel. Assuming here that the transistor $Q_1$ is now on (the problem occurs when the transistor $Q_2$ is on), the voltage $V_{WB}$ between the word line $Q_+$ and the bit line BL must be higher than a predetermined level to maintain the transistor $Q_1$ in a conductive state during the selection state of the corresponding word line. The predetermined level $V_{WB}$ mentioned above is equal to the sum of a voltage drop across the load $L_2$ and the base-emitter voltage of the transistor $Q_1$. Even though the predetermined level $V_{WB}$ is assured for the selected memory cell MC in the first memory cell array $MCA_1$, it is not assured for the second memory cell array $MCA_2$. Hence, the level $V_{WB}$ is lowered to $V'_{WB}$. The level $V'_{WB}$ is here expressed as $V'_{WB} = V_{WB} - V_{BE}$, where $V_{BE}$ denotes the above-mentioned base-emitter voltage of the word driver transistor $Q_{wd2}$. In this case, an output voltage of each bit driver (mentioned hereinafter) is increased relative to the lowering of $V_{WB}$, which output voltage is used to determine the voltage of the bit line BL. Due to the relative increase of the output voltage, a bit line driver transistor (mentioned hereinafter) can become saturated. In the saturated state, the read operation speed is reduced. To counter this, a level shifting means is employed in each of the bit drivers connected to the memory cell array $MCA_2$. This also applies to other bit drivers connected to the memory cell arrays $MCA_3$, ..., $MCA_n$ following thereafter. Thus, the voltage $V'_{WB} = (V_{WB} - V_{BE})$ is shifted upward in level by $V_{BE}$. The above-mentioned voltage $V_{WB}$ assured in the memory cell array $MCA_1$ can thereby also be assured in the memory cell array $MCA_2$.

Figure 6:
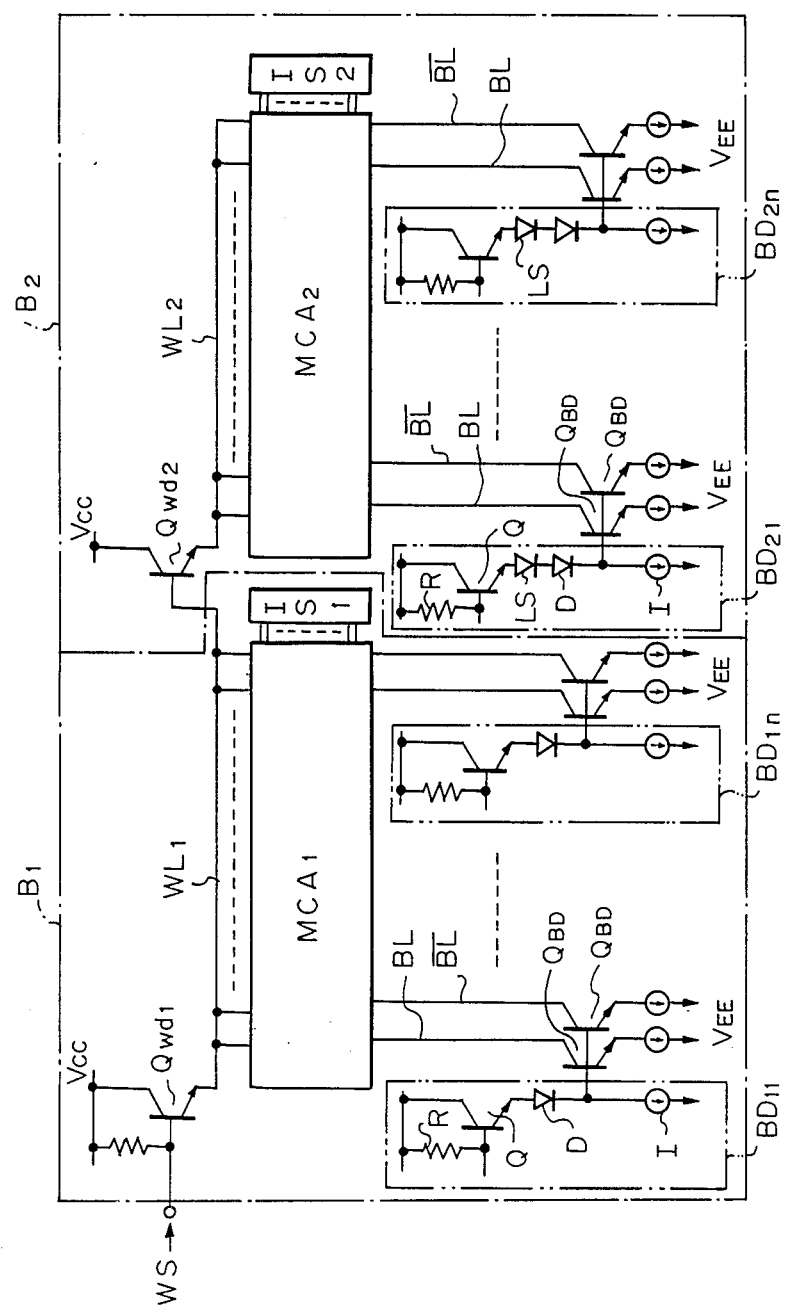
FIG. 6 is a more detailed circuit diagram of the semiconductor memory device based on the device illustrated in FIG. 4A.

FIG. 6 is a more detailed circuit diagram of the semiconductor memory device based on the device shown in FIG. 4A. In FIG. 6, the bit drivers are specifically illustrated with reference characters $BD_{11}$ through $BD_{1n}$ and $BD_{21}$ through $BD_{2n}$. The bit driver transistors in each of the bit drivers are specifically illustrated with reference characters $Q_{BD}$. The level shifting means is represented by reference characters LS in the block containing the second $MCA_2$. It should be understood that only two blocks $B_1$ and $B_2$ are illustrated for simplicity and to conform to the example of FIG. 4A. In the first block $B_1$, each of the first bit drivers $BD_{11}$ through $BD_{1n}$ includes a resistor R, transistor Q, diode D, and a constant current source I. This is true for each bit driver in the second block $B_2$.

In the second block $B_2$, as previously mentioned, the bit line voltage has a voltage difference of $V'_{WB} = (V_{WB} - V_{BE})$ relative to the word line voltage. The thus lowered voltage $V'_{WB}$ must be restored to the nominal voltage $V_{WB}$, as in the first block $B_1$. For this, the level shift means LS is employed. The level shift means LS can be realized by diodes, as exemplified in the bit drivers $BD_{21}$ through $BD_{2n}$. As is well known, diodes inherently function to shift the voltage level with a level equal to $V_{BE}$. Therefore, the bit line level can be lowered by $V_{BE}$ with the use of the diode LS, and the relative voltage $V'_{WB}$ can thereby be increased to $V_{WB}$. In this regard, it will be apparent that, in a third block ($B_3$), which is not shown but may follow the block $B_2$, a similar level shifting means LS should comprise two diodes connected in series for producing a shift level of about $2 V_{BE}$.

Figure 7:
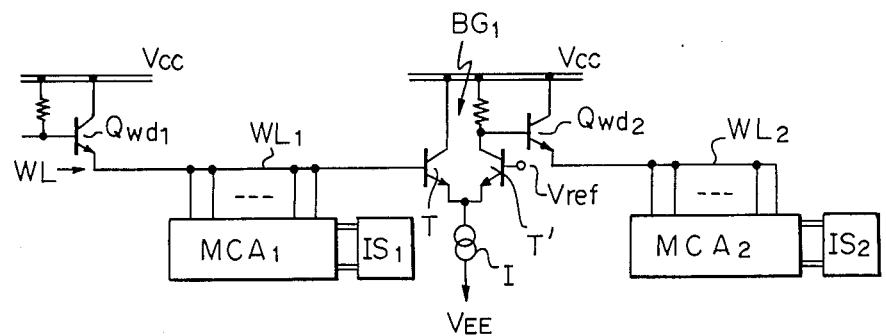
FIG. 7 is a circuit diagram of a part of a semiconductor memory device according to a second embodiment of the present invention.

FIG. 7 is a circuit diagram of a part of a semiconductor memory device according to a second embodiment of the present invention. FIG. 7 displays only two blocks for simplicity, as in FIG. 4A. In the second embodiment, the word driver transistor $Q_{wd2}$ is not directly connected at its base to the first word line segment $WL_1$, but is connected thereto via a buffer gate circuit $BG_1$ (T, T' and I). This also applies to the following word driver transistors. Each of the buffer gate circuits $BG_1$ is a differential transistor pair T and T' and a constant current source I commonly connected to transistor emitters. The base of one (T) of the differential transistor pair is connected to the preceding word line segment, i.e., $WL_1$, while the base of the other (T') receives a reference voltage $V_{ref}$ and its collector is connected to the base of the word driver transistor $Q_{wd2}$. Due to the presence of the buffer gate circuit $BG_1$, the voltage at the second word line segment $WL_2$, i.e., the emitter voltage of the word driver transistor $Q_{wd2}$ is not lowered by $V_{BE}$, but the word line voltage level of the segment $WL_1$ is tranferred as it is to the word line segment $WL_2$. That is, the "H" level of $WL_1$ during the selection state is the same as the "H" level of the segment $WL_2$.

The operations are as follows. When the word line WL is not selected, the word driver transistor $Q_{wd1}$ is not activated. Accordingly, the level of the segment $WL_1$ is maintained at the "L" (low) level. Therefore, the transistor T of the differential transistor pair is also not activated. Conversely, the other transistor T' is activated. Thus, the word driver transistor $Q_{wd2}$ is not activated. Accordingly, the word line segment $WL_2$ is also left in the nonselection state and is of the "L" level.

On the other hand, when the corresponding word line WL is selected, the word driver transistor $Q_{wd1}$ is activated to increase the voltage level of the segment $WL_1$ toward the "H" level. Due to the "H" level of the segment $WL_1$, the transistor T is activated, while the transistor T' is not activated. At this time, the base voltage of the transistor $Q_{wd2}$ increases approximately up to the power source level $V_{cc}$. Therefore, the voltage level ("H") of the segment $WL_2$ reaches as high as the voltage level ("H") of the segment $WL_1$ to hold the selection state i.e. $V_{cc} - V_{BE}$. Thus, each of the word line segments $WL_2$, $WL_3$, . . . provides a sufficiently high level "H" during the selection state. This is true regardless of the number of the segments.

Figure 8:
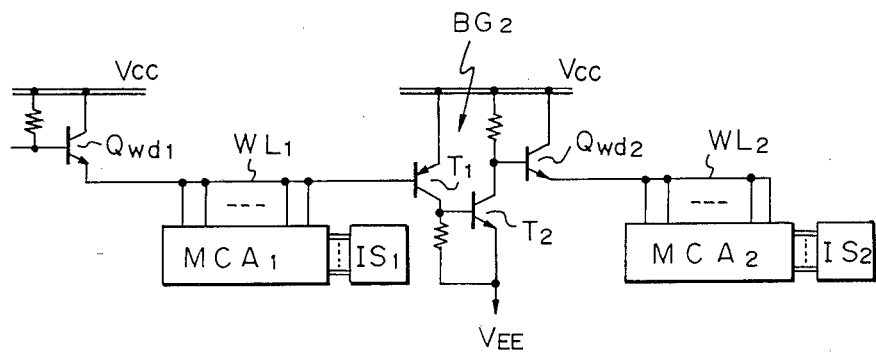
FIG. 8 is a circuit diagram of a part of a semiconductor memory device according to a modification of the second embodiment shown in FIG. 7.

FIG. 8 is a circuit diagram of a part of a semiconductor memory device according to a modification of the second embodiment illustrated in FIG. 7. In the modification, instead of the circuit $BG_1$ of FIG. 7, a buffer gate circuit $BG_2$ is used. The circuit $BG_2$ performs an identical role as the circuit $BG_1$ mentioned above. That is, the "H" level at the word line segment $WL_1$ can be transferred, as it is, to the segment $WL_2$. As seen from FIG. 8, each of the buffer gates $BG_2$ is comprised of a PNP transistor $T_1$ and an NPN transistor $T_2$. The PNP transistor $T_1$ is connected, at its base, to the preceding word line segment, i.e., $WL_1$. The output of the PNP transistor $T_1$ is connected to the NPN transistor $T_2$ at its base. The output of the NPN transistor $T_2$ is supplied to the base of the word driver transistor $Q_{wd2}$.

When the word line WL is not selected, the word driver transistor $Q_{wd1}$ is not activated. Accordingly, the level of the segment $WL_1$ is maintained at the "L" (low) level. Therefore, the PNP transistor $T_1$ is activated. Accordingly the NPN transistor $T_2$ is also activated, and thus the word driver transistor $Q_{wd2}$ is not activated. Thus, the word line segment $WL_2$ is also left in the nonselection state and is of the "L" level.

On the other hand, when the corresponding word line WL is selected, the word driver transistor $Q_{wd1}$ is activated to increase the voltage level of the segment $WL_1$ toward the "H" level. Due to the "H" level of the segment $WL_1$, the PNP transistor $T_1$ and the NPN transistor T' are not activated. At this time, the base voltage of the transistor $Q_{wd2}$ increases approximately up to the power source level $V_{cc}$. Therefore, the voltage level ("H") of the segment $WL_2$ reaches as high as the voltage level ("H") of the segment $WL_1$ to hold the selection state i.e. $V_{cc} - V_{BE}$. Thus, each of the word line segments $WL_2$, $WL_3$, . . . provides a sufficiently high level "H" during the selection state. This is true regardless of the number of the segments.

As explained above in detail according to the present invention, the current density in each word line can be considerably reduced. Therefore, the width of each word line can be narrowed further. This enables further miniaturization of an IC memory. It should be noted that the introduction of the individual private word drivers and the buffer gate circuits ($BG_1$ or $BG_2$) into the IC memory does not obstruct miniaturization because the word lines usually extend in the IC memory with a considerably large length and considerable space can be saved when reducing the widths of such lengthy word lines. The thus saved space is enough to accommodate the word drivers and the buffer gate circuits.

We claim:

1. A semiconductor memory device, operatively connected to a word decoder which generates a word selection signal at a memory selection time, said memory device comprising:
    a plurality of memory cells, each of said memory cells comprising a pair of bipolar transistors cross-coupled to form a flip-flop;
    a plurality of initial word drivers, each operatively connected to the word decoder and activated by the word selection signal from the word decoder;
    a plurality of bit line pairs operatively connected to said memory cells;
    a plurality of bit drivers, each operatively and respectively connected to one of said bit line pairs, for specifying a desired one of said memory cells in combination with the word selection signal;
    a plurality of word lines, operatively and respectively connected to said initial word drivers and said memory cells, forming cross points with said bit line pairs, said memory cells being located at the cross points, each of said word lines being divided into a plurality of word line segments, a first word line segment of each of said word lines being directly activated to carry a word line signal by one of said initial word drivers in dependence upon the word selection signal;

segment word drivers operatively connected between the word line segments, one of said segment word drivers being activated when the word selection signal activates a corresponding initial word driver operatively connected via a corresponding first word line segment to the one of said segment word drivers, each of said segment word drivers being formed by a single word driver transistor operatively connected to a following second word line segment and having a base operatively connected to the corresponding first word line segment; and level shifting means, operatively connected to said bit line pairs, for shifting downward bit line voltage levels corresponding to the second word line segments, so that a voltage difference between each of the word line segments and each of said bit lines forming cross points therewith does not vary due to the single word driver transistor in each of said segment word drivers.

2. A device as set forth in claim 1, wherein said level shifting means are provided only in said bit drivers operatively connected to the second word line segments.

3. A device as set forth in claim 2, wherein each of said level shifting means connected to bit line pairs crossing the second word line segments immediately following the first word line segments comprises a single diode operatively connected and corresponding to said bit line pairs crossing the second word line segments immediately following the first word line segments.

4. A device as set forth in claim 3, wherein each of said bit drivers including one of said level shifting means further includes a first bit driver transistor operatively connected to one bit line pair in said bit line pairs crossing the second word line segments and having a base operatively connected to said single diode in said level shifting means included therein.

5. A semiconductor memory device operatively connected to receive a word selection signal, comprising:

memory cells arranged in an array having rows and columns, each of the rows being divided into first and second segments;

first and second bit selection means, operatively connected and corresponding to the first and second segments in each of the rows of said memory cells, respectively, for selecting one of the columns of said memory cells;

word selection means, each of said word selection means operatively connected to an associated one of the rows of said memory cells, for selecting the associated one of the rows of said memory cells in dependence upon the word selection signal, each of said word selection means comprising:

a first segment word driver, operatively connected to the first segment of the associated one of the rows of said memory cells and to receive the word selection signal, for driving the first segment of the associated one of the rows of said memory cells in dependence upon the word selection signal; and a second segment word driver, operatively connected to the first and second segments of the associated one of the rows of said memory cells, for driving the second segment of the associated one of the rows of said memory cells when the first segment of the associated one of the rows of said memory cells is driven; and level shift means, operatively connected to said bit selection means corresponding to the columns of said memory cells in the second segment in each of the rows of said memory cells, for changing a voltage level supplied to said bit selection means to adjust for a voltage level change caused by said second segment word driver.

6. A semiconductor memory device as set forth in claim 5, wherein said first segment word driver comprises a first word driver transistor having a base operatively connected to receive the word selection signal and an emitter operatively connected to the first segment of the one of the rows of said memory cells, and wherein said second segment word driver comprises a second word driver transistor having a base operatively connected to the first segment of the one of the rows of said memory cells and an emitter operatively connected to the second segment of the one of the rows of said memory cells.

7. A semiconductor memory device as set forth in claim 6, wherein said bit selection means comprises:

first bit drivers, operatively connected to the first segment in each of the rows of said memory cells, for driving the memory cells in the first segment; and second bit drivers, operatively connected to said level shift means and the second segment in each of the rows of said memory cells, for driving said memory cells in the second segment.

* * * * *